(12) United States Patent
Ju

(10) Patent No.: US 9,604,300 B2
(45) Date of Patent: Mar. 28, 2017

(54) ELECTRICAL CONNECTOR WITH LASER SOLDERING AND METHOD FOR ASSEMBLING THE SAME

(71) Applicant: LOTES CO., LTD, Keelung (TW)

(72) Inventor: Ted Ju, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 14/882,172

(22) Filed: Oct. 13, 2015

(65) Prior Publication Data

US 2016/0261057 A1   Sep. 8, 2016

(30) Foreign Application Priority Data

Mar. 3, 2015   (CN) .......................... 2015 1 0093963

(51) Int. Cl.
| | |
|---|---|
| *B23K 1/005* | (2006.01) |
| *H01R 12/71* | (2011.01) |
| *H05K 3/34* | (2006.01) |
| *H01R 43/02* | (2006.01) |
| *H01R 12/52* | (2011.01) |
| *H01R 12/70* | (2011.01) |

(52) U.S. Cl.
CPC ......... *B23K 1/0056* (2013.01); *H01R 12/716* (2013.01); *H01R 43/0221* (2013.01); *H05K 3/3436* (2013.01); *H01R 12/526* (2013.01); *H01R 12/707* (2013.01); *H01R 43/0235* (2013.01); *H01R 43/0256* (2013.01); *H05K 2201/10189* (2013.01); *H05K 2203/041* (2013.01)

(58) Field of Classification Search
CPC ............ H01R 43/0235; H01R 43/0256; H01R 12/526; H01R 12/707
USPC ........................................................... 439/83
See application file for complete search history.

(56) References Cited

U.S. PATENT DOCUMENTS

| | | | |
|---|---|---|---|
| 8,147,256 B2 * | 4/2012 | Jin ........................ | H01R 12/52 |
| | | | 439/83 |
| 2001/0054637 A1 * | 12/2001 | Hayakawa ........... | B23K 1/0056 |
| | | | 228/102 |
| 2010/0267257 A1 * | 10/2010 | Yeh ....................... | H01R 12/57 |
| | | | 439/83 |
| 2012/0195015 A1 * | 8/2012 | Holzman ............. | H05K 3/3436 |
| | | | 361/769 |

* cited by examiner

*Primary Examiner* — Abdullah Riyami
*Assistant Examiner* — Justin Kratt
(74) *Attorney, Agent, or Firm* — Locke Lord LLP; Tim Tingkang Xia, Esq.

(57) ABSTRACT

An electrical connector for electrically connecting a chip module and a circuit board, includes an insulating body, multiple terminals, and multiple solders. The insulating body includes multiple receiving holes running therethrough and multiple resisting portions. The terminals are respectively located in the receiving holes. One end of each terminal is provided with a soldering portion, the soldering portion has a soldering surface, and the soldering surface is perpendicular to a surface of the circuit board. Left and right sides of the solder urge the soldering surface and the resisting portion respectively, a lower side of the solder is soldered onto the circuit board by reflow soldering, and the solder is soldered to the soldering surface by laser.

26 Claims, 6 Drawing Sheets

ELECTRICAL CONNECTOR WITH LASER SOLDERING AND METHOD FOR ASSEMBLING THE SAME

CROSS-REFERENCE TO RELATED APPLICATION

This non-provisional application claims priority under 35 U.S.C. §119(a) on Patent Application No. 201510093963.5 filed in P.R. China on Mar. 3, 2015, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connector and a method for assembling the same, and in particular, to an electrical connector for electrically connecting a chip module and a circuit board and a method for assembling the same.

BACKGROUND OF THE INVENTION

Chinese Patent Application No. 201210359807.5 discloses an electrical connector, including an insulating body 10, multiple terminals 20 received in the insulating body 10, and multiple soldering balls 30 used to be soldered onto a circuit board. The soldering ball 30 is irradiated by means of energy such as laser, so that the fused soldering ball 30 hits a lower surface 22 of the terminal 20 and the soldering ball 30 is fixed and attached to the lower surface 22 of the conducting terminal 20. The soldering ball 30 needs to be completely fused, and therefore it is energy-consuming and time-consuming. Moreover, before the soldering ball 30 is soldered to the terminal 20 by means of laser, the soldering ball 30 is not positioned, and because the soldering ball 30 hits the lower surface 22 of the terminal 20 at a position at a distance from the lower surface 22 of the terminal 20, it is not easy to manage and control the position at which the soldering ball 30 is fixed and attached to the lower surface 22 of the terminal 20. Additionally, a soldering surface on which the terminal 20 is soldered to the soldering ball by means of laser is parallel to a surface of the circuit board, and therefore different laser fusing extents of the soldering balls causes different heights of the soldering balls, thereby causing that some of the soldering balls cannot contact the surface of the circuit board, and a missing soldering phenomenon occurs, thereby affecting electrical conduction between the electrical connector and the circuit board.

Therefore, a heretofore unaddressed need exists in the art to address the aforementioned deficiencies and inadequacies.

SUMMARY OF THE INVENTION

In one aspect, the present invention relates to an electrical connector that can avoid difficultly of soldering between a solder and a terminal.

In one embodiment, an electrical connector for electrically connecting a mating element and a circuit board, includes an insulating body, multiple terminals, and multiple solders. The insulating body has multiple receiving holes running therethrough and multiple resisting portions. The multiple terminals are respectively received in the receiving holes. One end of each of the terminals is provided with a soldering portion. A side of the soldering portion has a soldering surface, and the soldering surface is perpendicular to a surface of the circuit board. The multiple solders are used for being soldered onto the surface of the circuit board downward. Two sides of each of the solders respectively urge the soldering surface and corresponding one of the resisting portions, and each of the solders is soldered to the soldering surface by means of laser.

In one embodiment, the soldering portion and the resisting portion are disposed opposite to each other; or each of the solders urges two resisting portions, and the soldering portion and the two resisting portions are disposed triangularly.

In one embodiment, the insulating body further includes a reserved space at a side of the soldering surface. When the solder is loaded, the solder urges the soldering portion, so that the soldering portion elastically moves toward the reserved space. After the solder is soldered to the soldering surface by means of laser, the soldering portion elastically moves in a direction from the reserved space toward the solder.

In one embodiment, the insulating body further has a stopping block located above the solder, and the stopping block is used to stop the solder from moving upward.

In one embodiment, there is a distance between the stopping block and the solder.

In one embodiment, another end of the terminal is provided with a contact portion exposed out of the insulating body, the contact portion is used to contact the mating element, and the mating element is a chip module.

In one embodiment, the terminal has a base portion, and the base portion is disposed vertically. The contact portion extends from an upper end of the base portion upward. A side of the base portion is bent to form a connecting portion. The soldering portion extends from the connecting portion downward, and the soldering portion and the connecting portion are not on a same plane with the base portion.

In one embodiment, the solder is a tin ball. A side of the tin ball urging the soldering surface is fused and soldered to the soldering surface, and another side of the tin ball urging the resisting portion and a lower side of the tin ball keep arc-shaped.

In another aspect, the present application relates to a method for assembling an electrical connector for electrically connecting a mating element and a circuit board. In one embodiment, the method includes the steps of:

S1: providing an insulating body, wherein the insulating body comprises a plurality of receiving holes running therethrough and a plurality of resisting portions;

S2: providing a plurality of terminals, and respectively assembling the terminals into the receiving holes, wherein one end of each of the terminals is provided with a soldering portion, and the soldering portion is provided with a soldering surface;

S3: providing a plurality of solders, wherein each of the solders is located between corresponding one of the soldering portions and corresponding one of the resisting portions;

S4: introducing an inert gas into the soldering surface; and

S5: soldering the solder to the soldering surface by means of laser.

In one embodiment, after step S5, the circuit board is provided, a lower side of the tin ball is soldered to a surface of the circuit board by means of reflow soldering, and the soldering surface is perpendicular to the surface of the circuit board.

In one embodiment, the solder is a tin ball, a side of the tin ball approximating the soldering surface is fused and soldered to the soldering surface, and another side of the tin ball approximating the resisting portion and a lower side of the tin ball keep arc-shaped.

In one embodiment, left and right sides of the solder urge the soldering portion and the resisting portion respectively.

In one embodiment, the soldering portion and the resisting portion are disposed opposite to each other; or, each of the solders urges two resisting portions, and the soldering portion and the two resisting portions are disposed triangularly.

In one embodiment, the insulating body further has a reserved space at a side of the soldering surface, and when the solder is loaded, the solder urges the soldering portion, so that the soldering portion elastically moves toward the reserved space; and after step S5, the soldering portion elastically moves in a direction from the reserved space toward the solder.

In one embodiment, the inert gas is nitrogen.

In one embodiment, the insulating body further has a stopping block above the solder used to stop the solder from moving upward.

In one embodiment, there is a distance between the stopping block and the solder.

In one embodiment, another end of the terminal is provided with a contact portion exposed out of the insulating body, the contact portion is used to contact the mating element, and the mating element is a chip module.

In one embodiment, the terminal has a base portion, the base portion is disposed vertically, the contact portion extends from an upper end of the base portion upward, a side of the base portion is bent to form a connecting portion, the soldering portion extends from the connecting portion downward, and the soldering portion and the connecting portion are not on a same plane with the base portion.

In a further aspect, the present invention relates to a method for assembling an electrical connector for electrically connecting a mating element and a circuit board. In one embodiment, the method includes the following steps:

S1: providing an insulating body, wherein the insulating body comprises a plurality of receiving holes running therethrough and a plurality of resisting portions;

S2: providing a plurality of terminals, and respectively assembling the terminals into the receiving holes, wherein one end of each of the terminals is provided with a soldering portion, and a side of the soldering portion is provided with a soldering surface;

S3: providing a plurality of multiple solders, wherein each of the solders is located between corresponding one of the soldering portions and corresponding one of the resisting portions;

S4: soldering the solder to the soldering surface by means of laser; and

S5: providing the circuit board, and soldering a lower side of the tin ball to a surface of the circuit board by means of reflow soldering, wherein the soldering surface is perpendicular to the surface of the circuit board.

In one embodiment, after step S3, an inert gas is introduced into the soldering surface.

In one embodiment, after step S3, the electrical connector is placed in a space of an inert gas.

In one embodiment, the solder is a tin ball, a side of the tin ball approximating the soldering surface is fused and soldered to the soldering surface, and a side of the tin ball approximating the resisting portion and a lower side of the tin ball keep arc-shaped.

In one embodiment, left and right sides of the solder urge the soldering portion and the resisting portion respectively.

In one embodiment, the soldering portion and the resisting portion are disposed opposite to each other; or, each of the solders urges two resisting portions, and the soldering portion and the two resisting portions are disposed triangularly.

In one embodiment, the insulating body further has a reserved space at a side of the soldering surface, and when the solder is loaded, the solder urges the soldering portion, so that the soldering portion elastically moves toward the reserved space; and after step S4, the soldering portion elastically moves in a direction from the reserved space toward the solder.

In one embodiment, the insulating body further includes a stopping block above the solder used to stop the solder from moving upward.

In one embodiment, there is a distance between the stopping block and the solder.

In one embodiment, each of the terminals has a base portion, the base portion is disposed vertically, a contact portion used to contact the mating element extends from an upper end of the base portion upward, the contact portion is exposed out of the insulating body, a side of the base portion is bent to form a connecting portion, the soldering portion extends from the connecting portion downward, and the soldering portion and the connecting portion are not on a same plane with the base portion.

Compared with the related art, in certain embodiments of the present invention, it only needs to fuse the solder by means of laser at a contact area between the solder and the terminal, and therefore the solder is locally fused, thereby saving energy and time. Moreover, before the solder is soldered to the soldering portion of the terminal by means of laser, because two sides of the solder urge the soldering surface and the resisting portion, it is ensured that the position of the solder is accurate. In addition, the soldering surface on which the terminal is soldered to the solder by means of laser is perpendicular to the surface of the circuit board, and therefore heights of solders will not be inconsistent due to different fusing extents of the solders.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
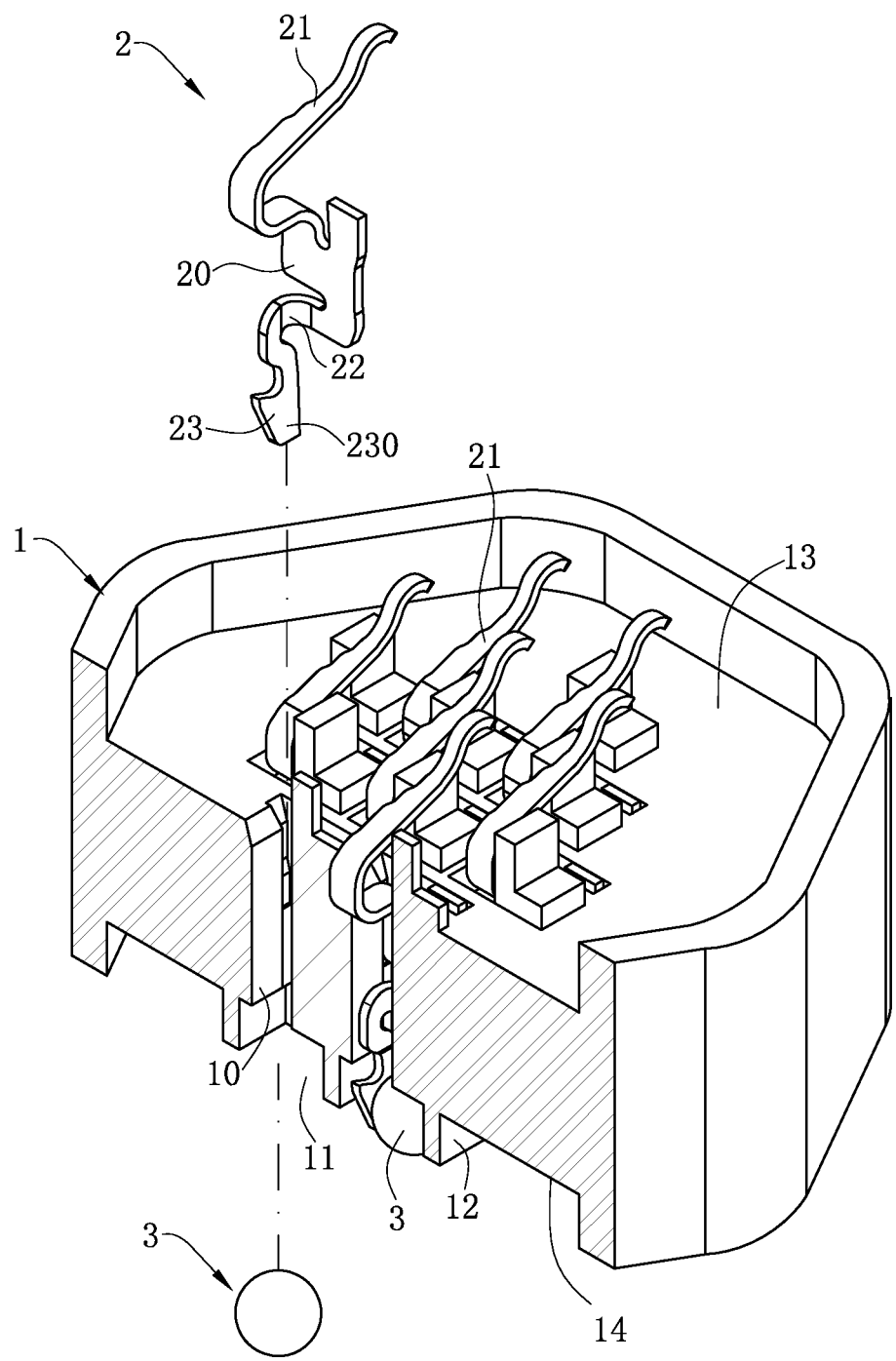
FIG. 1 is a schematic three-dimensional sectional view of an electrical connector according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-6. In accordance with the purposes of this invention, as embodied and broadly described herein, this invention, in one aspect, relates to an electrical connector.

Figure 2:
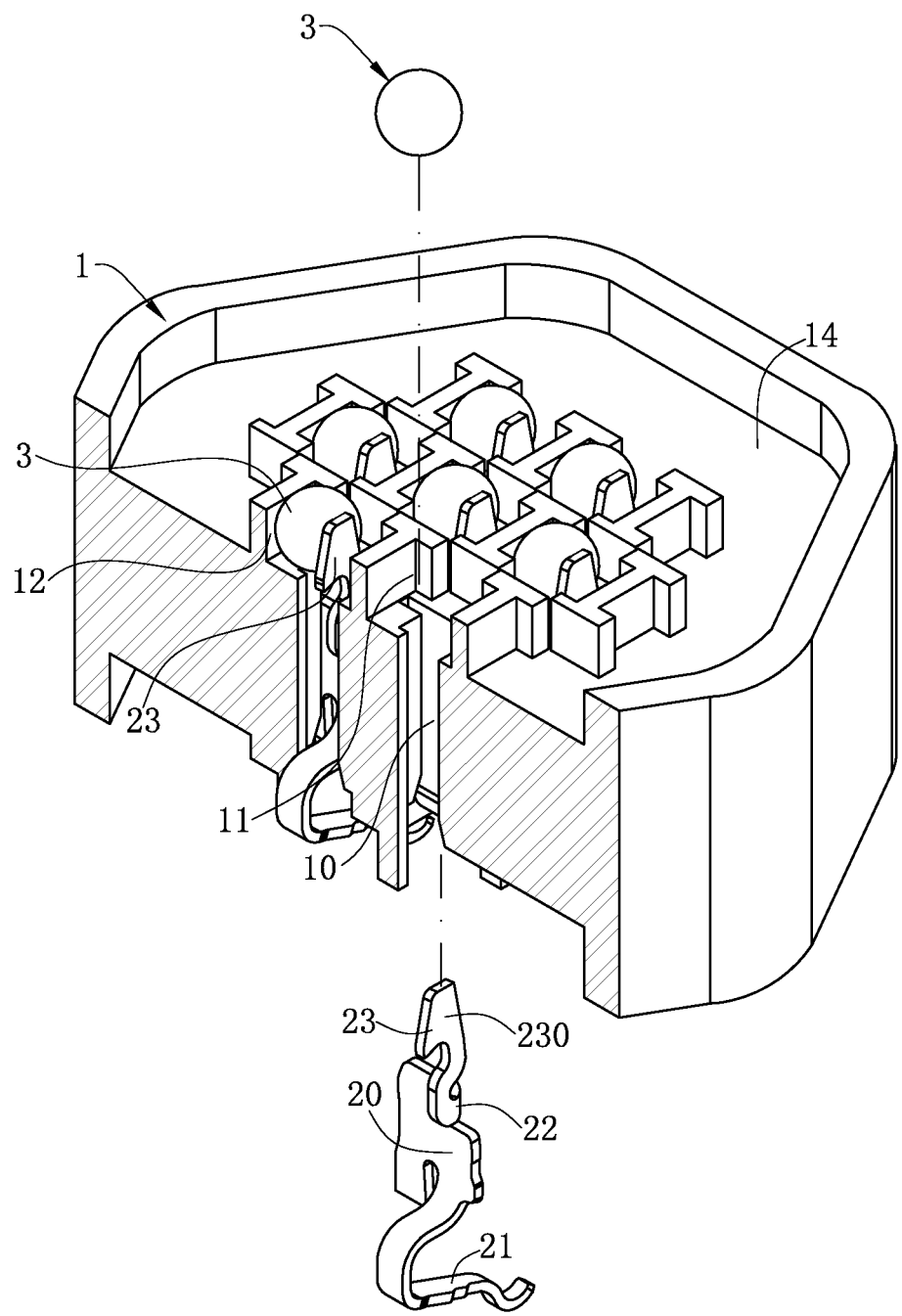
FIG. 2 is a schematic three-dimensional sectional view of the electrical connector in another direction according to one embodiment of the present invention.
Figure 3:
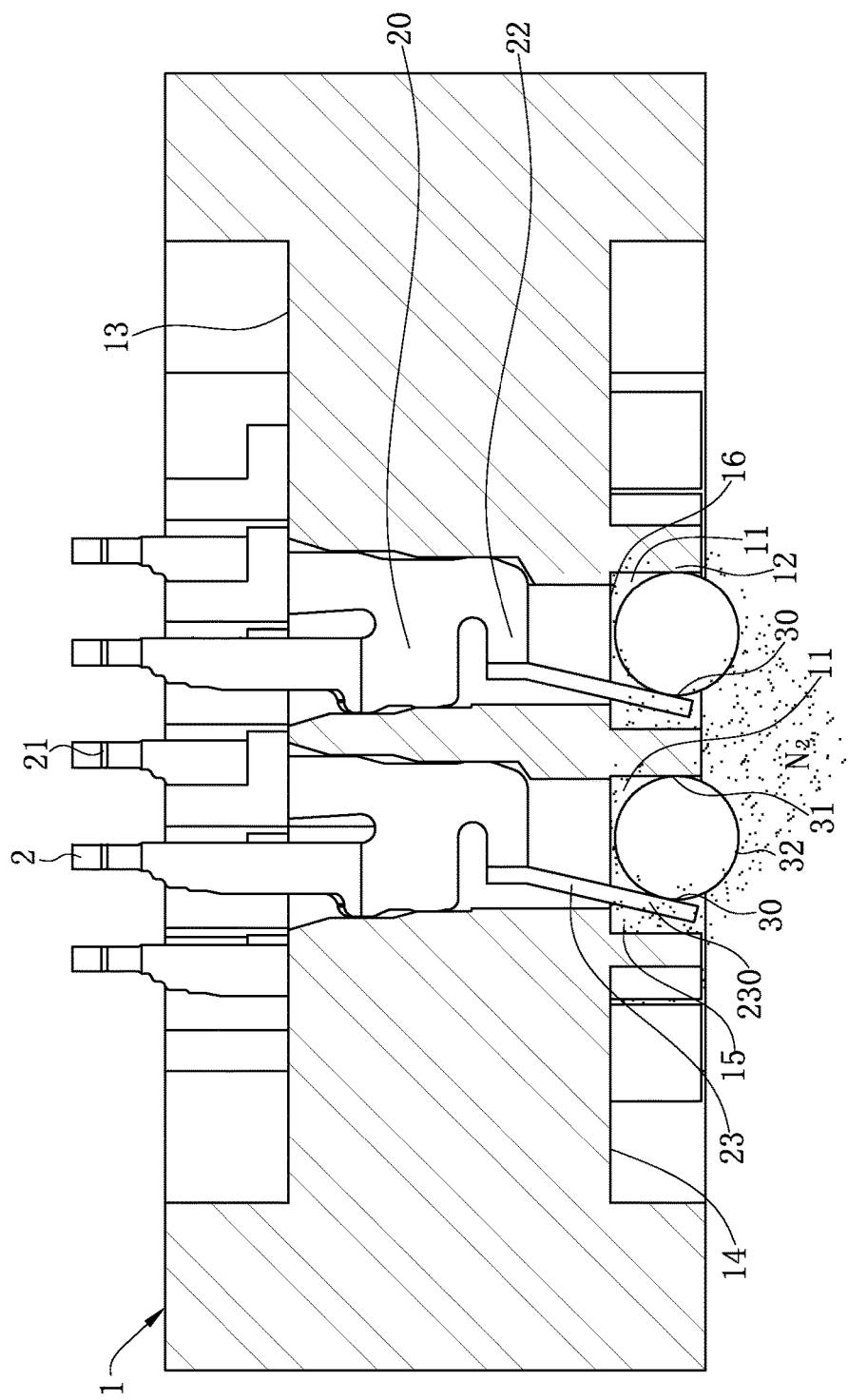
FIG. 3 is a schematic sectional view showing that tin balls of the electrical connector are loaded in soldering spaces and nitrogen is introduced into the soldering spaces.

Referring to FIGS. 1-3, an electrical connector according to one embodiment of the present invention is shown and used to electrically connect a mating element (not shown) and a circuit board 4. An upper surface of the circuit board 4 is provided with a soldering area (not labeled) used to be soldered to a solder. In this embodiment, the solder is a tin ball 3 (in other embodiments, the solder may not be a tin ball 3), and the mating element is chip module. The electrical connector includes an insulating body 1. The insulating body 1 has an upper surface 13 adjacent to the chip module and a lower surface 14 adjacent to the soldering area of the circuit board 4. The insulating body 1 is provided with multiple receiving holes 10 running through the upper surface 13 and the lower surface 14. A soldering space 11 for accommodating the tin ball 3 is disposed below the receiving hole 10. The insulating body 1 has a resisting portion 12 located in the soldering space 11 and a stopping block 16 located above the tin ball 3 for stopping the tin ball 3 from moving upward.

Figure 4:
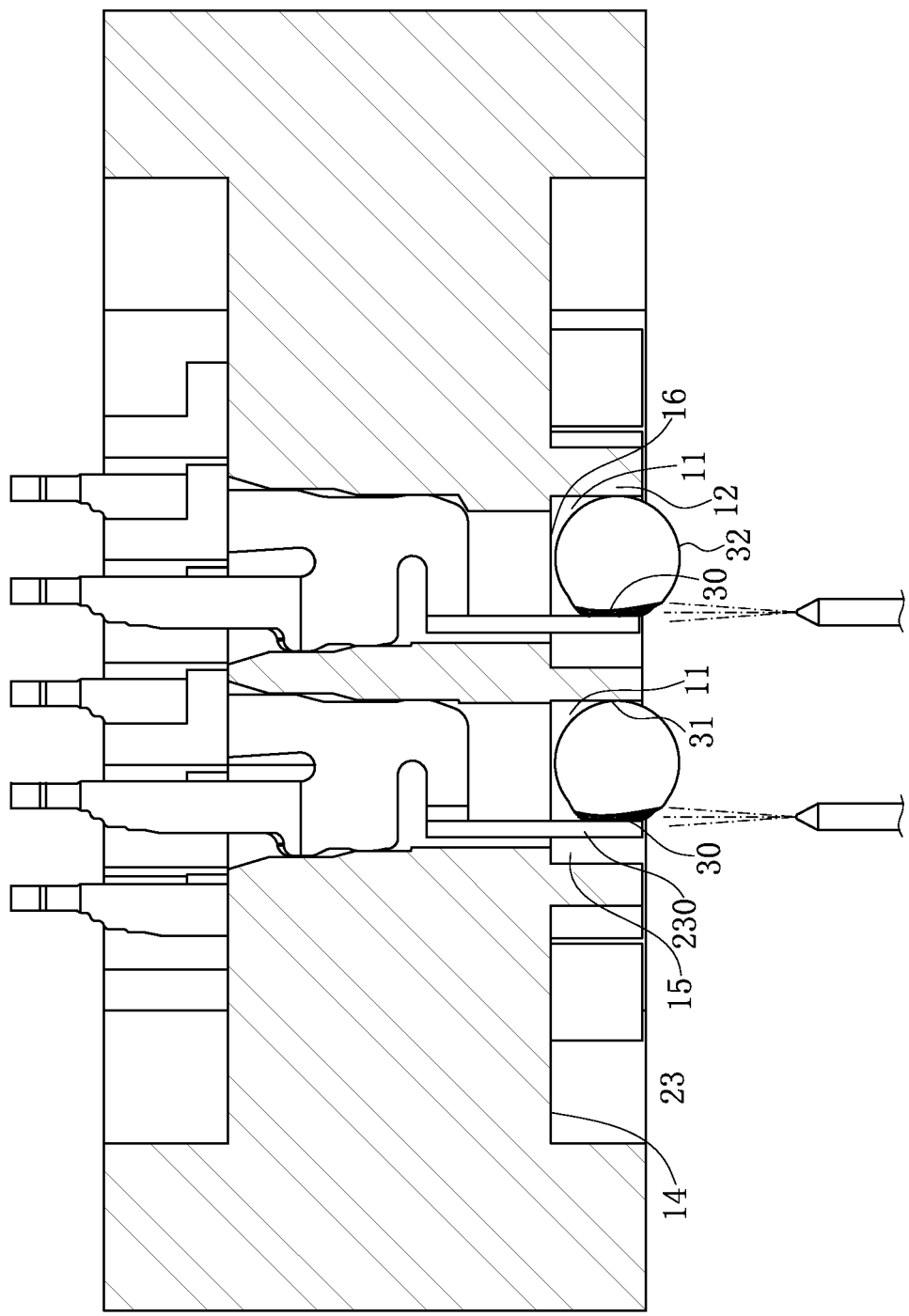
FIG. 4 is a schematic sectional view showing that the tin balls of the electrical connector are soldered to corresponding soldering portions by means of laser.

Referring to FIGS. 2-4, the electrical connector further includes multiple terminals 2 respectively received in the receiving holes 10. The terminal 2 has a base portion 20, and the base portion 20 is disposed vertically. A contact portion 21 extends from an upper end of the base portion 20 upward, and the contact portion 21 is exposed from the upper surface 13 of the insulating body 1 for contacting the chip module. A side of the base portion 20 is bent to form a connecting portion 22. A soldering portion 23 extends from the connecting portion 22 downward. The soldering portion 23 and the connecting portion 22 are not on a same plane with the base portion 20. The soldering portion 23 is located in the soldering space 11 and disposed opposite to the resisting portion 12 (in other embodiments, the soldering portion 23 may not be disposed opposite to the resisting portion 12, and if there are two resisting portions, the soldering portion and the two resisting portions are disposed triangularly, and the solder resists the soldering portion and the two resisting portions, so as to prevent the solder from moving all around). The soldering portion 23 is provided with a soldering surface 230, and the soldering surface 230 is perpendicular to the upper surface of the circuit board 4. A reserved space 15 is disposed at a side of the soldering surface 230. When the tin ball 3 is loaded in the soldering space 11, the tin ball 3 resists the soldering portion 23, so that the soldering portion 23 elastically moves toward the reserved space 15.

Referring to FIGS. 3-6, a method for assembling the electrical connector of the present invention is shown, and includes the following steps.

Step S1: providing the insulating body 1.

Then, perform step S2: providing the terminals 2, and respectively receiving each of the terminals 2 in the corresponding one of the receiving holes 10, so that the base portion 20 is fixed into the receiving hole 10, the contact portion 21 is exposed from the upper surface 13 of the insulating body 1, and the soldering portion 23 is located in the soldering space 11 and disposed opposite to the resisting portion 12.

Then, perform step S3: providing the tin balls 3. Each of the tin balls 3 is provided with a left side 30 and a right side 31 opposite to each other. Each of the tin balls 3 is respectively loaded in the soldering space 11, so that the left side 30 of the tin ball 3 urges the soldering surface 230, the right side 31 of the tin ball 3 urges the resisting portion 12 (in other embodiments, the tin ball 3 may only be located between the soldering surface 230 and the resisting portion 12 but does not need to urge the soldering surface 230 and the resisting portion 12), and the tin ball 3 urges the soldering portion 23 so that the soldering portion 23 elastically moves into the reserved space 15. The stopping block 16 is located above the tin ball 3 to stop the tin ball 3 from moving upward, and there is a distance (not labeled) between the stopping block 16 and the tin ball 3.

Then, perform step S4: introducing an inert gas (not labeled) into the soldering space 11. In this embodiment, the inert gas is nitrogen (in other embodiments, the inert gas may not be nitrogen), so that the soldering portion 23 and the tin ball 3 are located in a nitrogen environment. In other embodiments, the electrical connector may be placed in a space fully filled with nitrogen.

Then, perform step S5: soldering the tin ball 3 to the soldering surface 230 by means of laser. In this embodiment, only the left side 30 of the tin ball 3 is fused by means of laser and soldered to the soldering surface 230, and the right side 31 of the tin ball 3 urging the resisting portion 12 and the lower side 32 of the tin ball 3 keep arc-shaped. After the tin ball 3 is soldered to the soldering surface 230 by means of laser, the soldering portion 23 elastically moves in a direction from the reserved space 15 toward the tin ball 3.

Then, perform step S6: locating the circuit board 4 below the insulating body 1, and soldering the lower side 32 of the tin ball 3 to the soldering area of the upper surface of the circuit board 4 by means of reflow soldering, where the soldering surface 230 is perpendicular to the upper surface of the circuit board 4.

Figure 5:
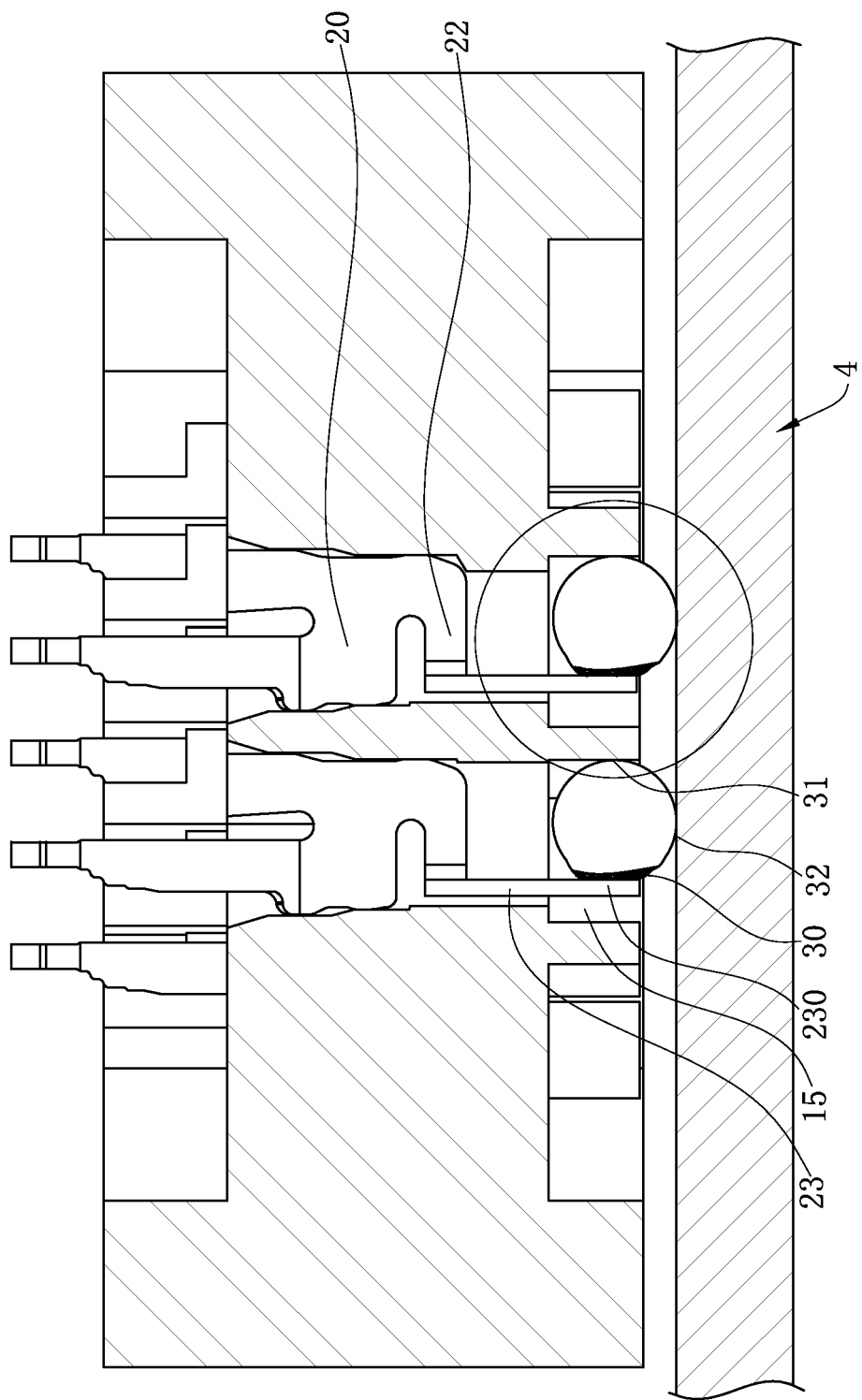
FIG. 5 is a schematic sectional view showing that the tin balls of the electrical connector are soldered to a circuit board.
Figure 6:
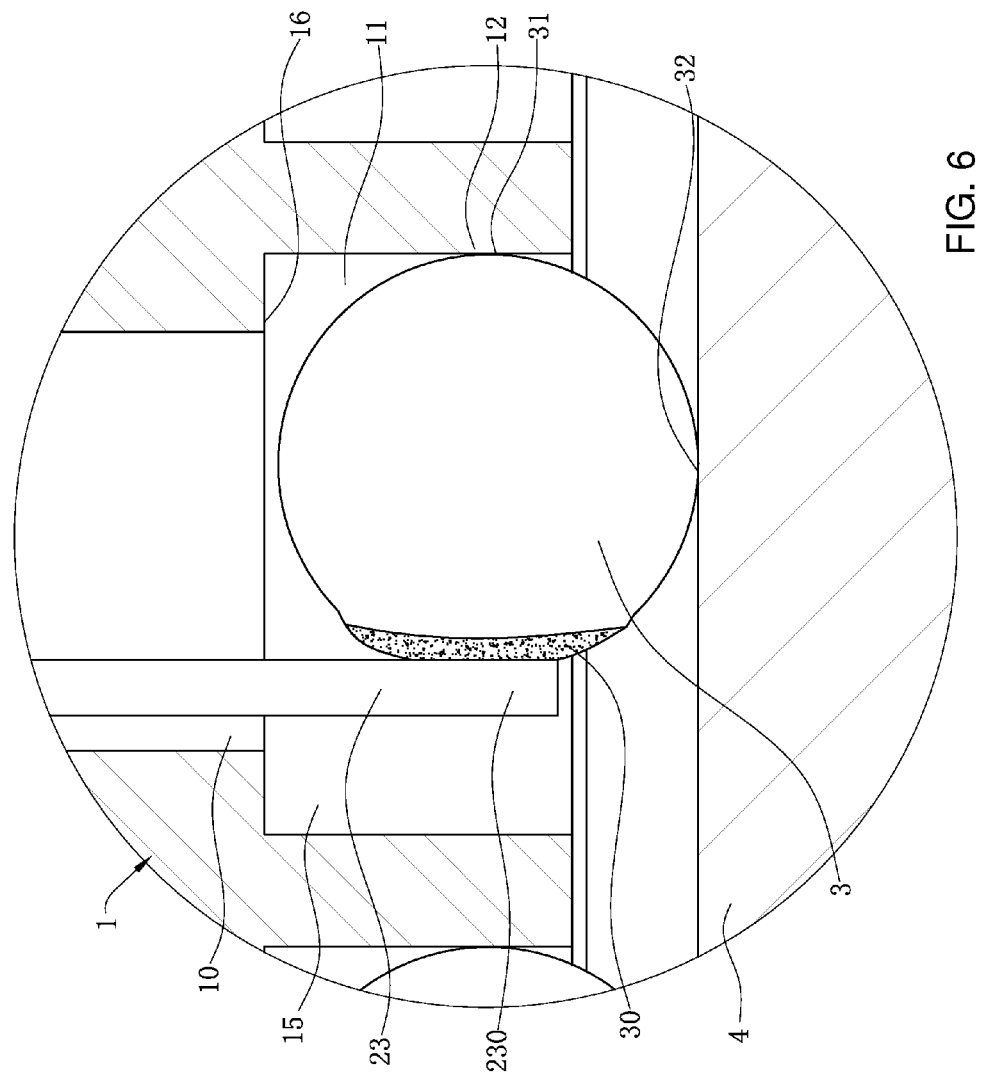
FIG. 6 is a local enlarged view of FIG. 5.

Referring to FIGS. 3-5, before the electrical connector is soldered to the circuit board 4, the tin ball 3 is first soldered to the soldering portion 23 of the terminal 2 by means of laser, so that when the electrical connector is soldered to the circuit board 4, a problem that if the quantity of tin paste is excessively few, volatile ingredients in the tin paste cannot clean oxides on surfaces of the tin ball 3 and the soldering surface 230, which causing soldering difficulty between the tin ball 3 and the soldering surface 230 is avoided, and thereby a situation in which the terminal 2 is soldered to the circuit board 4 undesirably is avoided.

The electrical connector and the method for assembling the same according to certain embodiments of the present invention, among other things, have the following beneficial advantages.

1. In certain embodiments of the present invention, before the tin ball 3 is soldered onto the circuit board 4, the tin ball 3 is first soldered to the soldering portion 23 by means of laser, so that the tin ball 3 is first fixed to the soldering portion 23, so as to avoid a problem that when the electrical connector is soldered to the circuit board 4, if the quantity of the tin paste is excessively few, the volatile ingredients in the tin paste cannot clean the oxides on the surfaces of the tin ball 3 and the soldering surface 230 and thus causing soldering difficulty between the tin ball 3 and the soldering surface 230.

2. In certain embodiments of the present invention, before the tin ball 3 is soldered to the soldering portion 23 by means of laser, nitrogen is filled in the soldering space 11 so that the tin ball 3 and the soldering portion 23 are located in an inert gas environment, so as to prevent the tin ball 3 and the soldering portion 23 from being oxidized by a high temperature during laser soldering.

3. In certain embodiments of the present invention, only the left side 30 of the tin ball 3 is fused on the soldering surface 230 by means of laser soldering, and the right side 31 of the tin ball 3 resisting the resisting portion 12 and the lower side 32 of the tin ball 3 keep arc-shaped, thereby saving energy and time; and because the lower side 32 of the tin ball 3 still keeps regularly arc-shaped after laser soldering, when being soldered to the circuit board 4, the tin ball 3 is easily soldered to the circuit board 4.

4. The soldering surface 230 of the terminal 2 soldered to the tin ball 3 by means of laser is perpendicular to the surface of the circuit board 4, and therefore heights of tin balls 3 will not be inconsistent due to different fusing extents of the tin balls.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a mating element and a circuit board, comprising:
    an insulating body, having a plurality of receiving holes running therethrough and a plurality of resisting portions;
    a plurality of terminals, respectively received in the receiving holes, wherein one end of each of the terminals is provided with a soldering portion, a side of the soldering portion has a soldering surface, and the soldering surface is perpendicular to a surface of the circuit board; and
    a plurality of solders for being soldered onto the surface of the circuit board downward, wherein two sides of each of the solders respectively press against the soldering surface and corresponding one of the resisting portions, and each of the solders is soldered to the soldering surface by means of laser,
    wherein the insulating body further comprises a reserved space at a side of the soldering surface, and when the solder is loaded, the solder presses against the soldering portion, so that the soldering portion elastically moves toward the reserved space, and during the soldering of the solder to the soldering surface by means of laser, the soldering portion elastically moves in a direction away from the reserved space toward the solder.

2. The electrical connector according to claim 1, wherein the soldering portion and the resisting portion are disposed opposite to each other; or, each of the solders presses against two resisting portions, and the soldering portion and the two resisting portions are disposed triangularly.

3. The electrical connector according to claim 1, wherein the solder is a tin ball, a side of the tin ball pressing against the soldering surface is fused and soldered to the soldering surface, and another side of the tin ball pressing against the resisting portion and a lower side of the tin ball keep arc-shaped.

4. The electrical connector according to claim 1, wherein the insulating body further comprises a stopping block located above the solder, and used to stop the solder from moving upward.

5. The electrical connector according to claim 4, wherein there is a distance between the stopping block and the solder.

6. The electrical connector according to claim 1, wherein another end of each of the terminals is provided with a contact portion exposed out of the insulating body, the contact portion is used to contact the mating element, and the mating element is a chip module.

7. The electrical connector according to claim 6, wherein each of the terminals has a base portion, the base portion is disposed vertically, the contact portion extends from an upper end of the base portion upward, a side of the base portion is bent to form a connecting portion, the soldering portion extends from the connecting portion downward, and the soldering portion and the connecting portion are not on a same plane with the base portion.

8. A method for assembling an electrical connector for electrically connecting a mating element and a circuit board, comprising the steps of:
S1: providing an insulating body, wherein the insulating body comprises a plurality of receiving holes running therethrough and a plurality of resisting portions;
S2: providing a plurality of terminals, and respectively assembling the terminals into the receiving holes, wherein one end of each of the terminals is provided with a soldering portion, and the soldering portion is provided with a soldering surface;
S3: providing a plurality of solders, wherein each of the solders is located between a corresponding one of the soldering portions and a corresponding one of the resisting portions;
S4: introducing an inert gas around the soldering surface; and
S5: soldering the solder to the soldering surface by means of laser,
wherein the insulating body further comprises a reserved space at a side of the soldering surface, and when the solder is loaded, the solder presses against the soldering portion, so that the soldering portion elastically moves toward the reserved space, and during step S5, the soldering portion elastically moves in a direction away from the reserved space toward the solder.

9. The method for assembling an electrical connector according to claim 8, wherein after step S5, the circuit board is provided, a lower side of the solder is soldered to a surface of the circuit board by means of reflow soldering, and the soldering surface is perpendicular to the surface of the circuit board.

10. The method for assembling an electrical connector according to claim 8, wherein the solder is a tin ball, a side of the tin ball approximating the soldering surface is fused and soldered to the soldering surface, and another side of the tin ball approximating the resisting portion and a lower side of the tin ball keep arc-shaped.

11. The method for assembling an electrical connector according to claim 8, wherein the inert gas is nitrogen.

12. The method for assembling an electrical connector according to claim 8, wherein left and right sides of the solder press against the soldering portion and the resisting portion respectively.

13. The method for assembling an electrical connector according to claim 12, wherein the soldering portion and the resisting portion are disposed opposite to each other; or, each of the solders presses against two resisting portions, and the soldering portion and the two resisting portions are disposed triangularly.

14. The method for assembling an electrical connector according to claim 8, wherein the insulating body further comprises a stopping block above the solder used to stop the solder from moving upward.

15. The method for assembling an electrical connector according to claim 14, wherein there is a distance between the stopping block and the solder.

16. The method for assembling an electrical connector according to claim 8, wherein another end of each of the terminals is provided with a contact portion exposed out of the insulating body, the contact portion is used to contact the mating element, and the mating element is a chip module.

17. The method for assembling an electrical connector according to claim 16, wherein each of the terminals has a base portion, the base portion is disposed vertically, the contact portion extends from an upper end of the base portion upward, a side of the base portion is bent to form a connecting portion, the soldering portion extends from the connecting portion downward, and the soldering portion and the connecting portion are not on a same plane with the base portion.

18. A method for assembling an electrical connector for electrically connecting a mating element and a circuit board, comprising the following steps:
S1: providing an insulating body, wherein the insulating body comprises a plurality of receiving holes running therethrough and a plurality of resisting portions;
S2: providing a plurality of terminals, and respectively assembling the terminals into the receiving holes, wherein one end of each of the terminals is provided with a soldering portion, and a side of the soldering portion is provided with a soldering surface;
S3: providing a plurality of solders, wherein each of the solders is located between a corresponding one of the soldering portions and a corresponding one of the resisting portions;
S4: soldering the solder to the soldering surface by means of laser; and
S5: providing the circuit board, and soldering a lower side of the solder to a surface of the circuit board by means of reflow soldering, wherein the soldering surface is perpendicular to the surface of the circuit board,
wherein the insulating body further comprises a reserved space at a side of the soldering surface, and when the solder is loaded, the solder presses against the soldering portion, so that the soldering portion elastically moves toward the reserved space, and during step S4, the soldering portion elastically moves in a direction away from the reserved space toward the solder.

19. The method for assembling an electrical connector according to claim 18, wherein after step S3, an inert gas is introduced around the soldering surface.

20. The method for assembling an electrical connector according to claim 18, wherein after step S3, the electrical connector is placed in a space of an inert gas.

21. The method for assembling an electrical connector according to claim 18, wherein the solder is a tin ball, a side of the tin ball approximating the soldering surface is fused and soldered to the soldering surface, and another side of the tin ball approximating the resisting portion and a lower side of the tin ball keep arc-shaped.

22. The method for assembling an electrical connector according to claim 18, wherein each of the terminals has a base portion, the base portion is disposed vertically, a contact portion used to contact the mating element extends from an upper end of the base portion upward, the contact portion is exposed out of the insulating body, a side of the base portion is bent to form a connecting portion, the soldering portion extends from the connecting portion downward, and the soldering portion and the connecting portion are not on a same plane with the base portion.

23. The method for assembling an electrical connector according to claim 18, wherein left and right sides of the solder press against the soldering portion and the resisting portion respectively.

24. The method for assembling an electrical connector according to claim 23, wherein the soldering portion and the resisting portion are disposed opposite to each other; or, each of the solders presses against two resisting portions, and the soldering portion and the two resisting portions are disposed triangularly.

25. The method for assembling an electrical connector according to claim 18, wherein the insulating body further comprises a stopping block above the solder used to stop the solder from moving upward.

26. The method for assembling an electrical connector according to claim 25, wherein there is a distance between the stopping block and the solder.

* * * * *